United States Patent [19]

Flachenecker et al.

[11] Patent Number: 4,922,210

[45] Date of Patent: May 1, 1990

[54] FEEDBACK-COUPLED HIGH-FREQUENCY POWER OSCILLATOR

[75] Inventors: Gerhard Flachenecker, Ottobrunn; Karl Fastenmeier, Munich; Heinz Lindenmeier, Planegg, all of Fed. Rep. of Germany

[73] Assignee: Erbe Elektromedizin GmbH, Tubingen, Fed. Rep. of Germany

[21] Appl. No.: 381,492

[22] Filed: Jul. 18, 1989

[30] Foreign Application Priority Data

Jul. 22, 1988 [DE] Fed. Rep. of Germany ....... 3824970

[51] Int. Cl.$^5$ .......................... H03B 1/02; H03B 5/08
[52] U.S. Cl. ................................. 331/167; 331/117 R
[58] Field of Search ............. 331/117 R, 117 FE, 167, 331/168

[56] References Cited

U.S. PATENT DOCUMENTS

3,276,032 9/1966 Ordower ......................... 331/117 X

Primary Examiner—Siegfried H. Grimm
Attorney, Agent, or Firm—Frishauf, Holtz, Goodman & Woodward

[57] ABSTRACT

A high-frequency power oscillator is built around a power amplifier utilizing semiconductors in a complementary or quasi-complementary stage which operate in a switching mode of operation. The output of the amplifier supplies high-frequency oscillations to a load impedance through an output filter composed of a series-resonant circuit and a parallel-resonant circuit. A feedback driving voltage is obtained from the output filter in a manner providing a first portion of the driving voltage from a voltage present in the parallel-resonant circuit for voltage feedback and a second portion of the driving voltage obtained by current inverse feedback from the current in the series-resonant circuit. These two components of the driving voltage are combined in an addition circuit and supplied to an input of the power amplifier through a pulse modification stage. In the case of high load impedances the operating frequency is as close as possible to the resonant frequency of the parallel resonant circuit and the superimposed current inverse feedback prevents the provision of an operating frequency that would approach the resonant frequency of the series-resonant circuit even when the losses in the series-resonant circuit are small. The ability to use a low-loss series-resonant circuit makes possible increased operation reliability, safety and efficiency.

22 Claims, 5 Drawing Sheets

FEEDBACK-COUPLED HIGH-FREQUENCY POWER OSCILLATOR

This invention concerns a feedback-coupled high-frequency power oscillator of the kind that uses a power amplifier operating in a switching mode and utilizing a complementary or quasicomplementary semiconductor stage having an output filter including a series-resonant circuit connected to the amplifier output and a parallel-resonant circuit on the output side of the series-resonant circuit and feedback circuit branches respectively for current feedback from the series-resonant circuit and voltage feedback from the parallel-resonant circuit.

For many industrial, medical or scientific applications high-power high-frequency electricity is needed. Examples from the industrial field are drying systems that operate with the heating of a material by dielectric losses in a high-frequency field or melting apparatus in which the heating of a melt is produced by eddy currents in a high-frequency field. In medicine electric power at high frequency is needed, for example, for high-frequency surgery and in scientific research it is needed for the excitation of a plasma for spectrum analysis.

It is common to most of these applications that the loading of the high-frequency power generator is as a rule not constant and is subjected to changes that are often very large and sudden. Another common aspect of these applications of high-frequency electric power is the fact that the effects which are to be generated with high-frequency power are not dependent upon a very strict maintenance of a particular frequency. In all the described applications, however, there is a requirement of high efficiency.

In order to obtain a high efficiency it is common today for the amplifying elements of the high-frequency power generator, preferably transistors, to be driven in a switching mode of operation. Such operation, however, brings with it harmonics in the spectrum of the output voltage which are accompanied disadvantages. Furthermore, the unavoidable parasitic components of the circuit produce strong oscillation overshoots which endanger the operational reliability of the amplifying elements by producing overvoltages. It is also known that in the case of switching mode amplifiers efficiency levels cannot be raised as high as one might like because of the switching-off delays of the amplifying elements.

In copending U.S. application Ser. No. 07/314,413, filed Feb. 22, 1989, now U.S. Pat. No. 4,890,073, and owned by the assignee of this application, a high-frequency power generator is described that seeks to overcome the above-described disadvantages by various measures, as follows.

A power amplifier is there shown in which the transistors are connected as a quasi-complementary stage and operate in a switching mode. At the output of this power amplifier, an output filter is connected that consists of a series-resonant circuit connected in series with the output of the amplifier and a parallel-resonant circuit connected in parallel with the output or with one end grounded. The series-resonant circuit is the first filter element as seen from the power amplifier. Both the series-resonant circuit and the parallel-resonant circuit are tuned as well as possible to the operating frequency.

As a result of the series-resonant circuit the output current of the power amplifier is almost purely sinusoidal. The current passes through zero after every half period of the high-frequency oscillation, i.e. exactly when the conducting condition is transferred from one to the other of the transistors. With this provision the switch-off losses are particularly small in the transistors, because the current has just gone to zero at the moment of switching off. Thus, switching-off delays effectively cease to appear in the transistors.

By means of the parallel-resonant circuit, the result is obtained that the output voltage is almost purely sinusoidal. Furthermore, with the parallel-resonant circuit the load impedance at the operating frequency can be brought to a real value, in order to reduce phase shifts between current and voltage as well as wattless (quadrature) currents.

In order to establish this condition as exactly as possible, various measures were recommended in the above-identified copending U.S. patent application. First, an auxiliary generator is used to excite the power amplifier into oscillation. As soon as a voltage substantially different from zero is found in the output circuit of the power amplifier in the course of starting up, or a current substantially different from zero, switch-over to self-excitation, i.e. oscillator operation, is provided. In this system the control voltage for the high-frequency power generator was derived from current flowing through the series-resonant circuit when the value of the load impedance connected to the high-frequency power generator went below a characteristic value and was derived from voltage appearing in the parallel-resonant circuit if the load impedance exceeded this characteristic value. In the first case current feedback was utilized, and in the second case voltage feedback.

The characteristic value of the load impedance is a value in which the real component $R_{load}$ of the load impedance more or less fulfills the condition $R_{load}^2 = L_p/C_s$, where $L_p$ is the inductance of the parallel-resonant circuit and $C_s$ is the capacitance of the series-resonant circuit The range of usable load impedances was thus subdivided into two ranges, namely a low-ohm range and a high-ohm range. In the case of load impedances in the low-ohm range current feedback was used, and in the case of load impedances in the high-ohm range, voltage feedback.

Voltage feedback presents considerable problems in practice. It is used to regulate the operating frequency of the high-frequency power amplifier operating into high-ohm value load impedances as accurately as possible at the resonance frequency of the parallel-resonant circuit, so that the current through the transistors of the power amplifier is as small as possible and as much as possible in phase with the output voltage. It has been found in practice, however, that this result is not obtained under certain circumstances. If the resonance frequencies of the two resonant circuits are not exactly the same, such as may happen by ageing of components, by misalignment of the resonant circuits or by reactive components of the load impedance, the operating frequency tends to approach closer to the resonant frequency of the series resonant circuit, the smaller the loss resistance of the series-resonant circuit is. For reasons of efficiency and of heating-up of the apparatus, efforts are always made to keep the loss resistance of the series-resonant circuit as low as possible. It can then occur that the parallel-resonant circuit is operated far outside its resonant frequency. Its reactive susceptance is thereby increased and a power amplifier is then loaded by an impedance having plainly evident reactive (wattless) components. Output current and output voltage of the power amplifier are then no longer in phase, the losses in the transistors will greatly increase and operational reliability of the high-frequency power generator will be subjected to serious risks.

SUMMARY OF THE INVENTION

It is an object of the present invention to provide a feedback-coupled high-frequency power oscillator which avoids the above-mentioned disadvantages. Briefly, this object is achieved by adding together in an addition circuit the voltages derived respectively by a current inverse feedback branch circuit and a voltage feedback branch circuit and then subjecting the output of the addition circuit to a pulse conversion stage for producing the driving voltage for the high-frequency amplifier.

In a power oscillator according to the invention, a first component of the driving voltage for the power amplifier is derived from a voltage present in the parallel-resonant circuit branch, thus producing voltage feedback. The second component of the driving voltage is derived from current flowing in the series-resonant circuit, by providing inverse current feedback as a second component of the driving voltage. These two components of the driving voltage are combined in an algebraic addition unit and then supplied to an input of the power amplifier through a pulse conversion stage. In this way a mixed voltage and current feedback is provided. As will be described further on, this mixed feedback has the advantage that the operating frequency is established very close to the resonant frequency of the parallel-resonant circuit at high-ohm value load impedances in the sense in which that term is used in the above-mentioned copending application, even when the series-resonant circuit has low losses (high Q). As a result the parallel-resonant circuit is very well tuned and its reactive susceptance is negligible. The amplitude of the output current and the phase shift between output current and output voltage then have their smallest possible values and the high-frequency power oscillator operates with maximum operational safety and reliability. In the case of a high-frequency power oscillator of the invention, therefore, the series-resonant circuit can well be optimized for low losses, without impairment of the operational safety and reliability of the oscillator.

The distinction between positive and negative feedback, with feedback designating positive or direct feedback when not otherwise qualified, is to be understood in the usual sense, with the usual allowances when the feedback is not fully in phase or in opposition to the signal being amplified. Thus a feedback has a reinforcing or amplifying effect on the physical magnitude from which the corresponding driving voltage is derived and an inverse or negative feedback has a weakening effect thereon. Because of the complex relations in the case of a combined positive and inverse feedback, it is not possible here to speak simply of cophased and phase opposition conditions in manner that might be possible for example for broadband amplifiers in cases of simple positive or inverse feedbacks. In the specification, accordingly, mention simply of feedback may be made even when both feedback branch circuits, namely the voltage feedback and the current inverse feedback are meant to be included.

In an advantageous development of the invention the feedback branches are so dimensioned that for the ratio of current inverse feedback to voltage feedback the following inequality relation is fulfilled:

$$R_c/v_u > R_{minload} \quad (1)$$

In that relation $v_u$ is the conversion factor for the first component of the driving voltage present at an input of the addition circuit with respect to its origin in a voltage present in the parallel-resonant circuit, $R_c$ is the conversion factor for the second second component of the driving voltage present at an input of the addition circuit with respect to its origin in a current in the series-resonant circuit.

$R_{minload}$ is the lowest value of the real portion of the load impedance of the high-frequency power generator that occurs in operation in the case of a high-frequency power generator such as is described in the above-mentioned copending patent application where, as above-mentioned, $R_{minload} = L_p/C_s$.

By means of measures above described in the present application, the current inverse feedback is prevented from outweighing the voltage positive feedback, since otherwise self-excitation of the high-frequency power oscillator will no longer be possible.

By the real component of a complex impedance there is normally understood the real component that is obtained by a conceptual splitting-out of real and imaginary parts in a series circuit. In the present case the load impedance is connected in parallel to a parallel-resonant circuit. Here it is more favorable to think of the load impedance as a parallel circuit composed of a real (loss dissipating) component and an imaginary (reactive) component. The word "imaginary" here has the meaning it takes in the algebra of complex variables as applied to electrical circuits. The imaginary component can simply be lumped together in the parallel-resonant circuit, while the real component remains as a real load resistance in parallel to the reactive parallel resonant circuit. Here in the remainder of this description there should be understood as the real component of the load impedance that real component which is found by a conceptual splitting of the load impedance into a parallel combination of a real component and an imaginary component, and then the imaginary component of the load impedance will be added algebraically to that of the parallel-resonant circuit, while the parallel loss resistance of the parallel-resonant circuit is combined in the usual way with the real component of the load impedance in parallel thereto.

BRIEF DESCRIPTION OF THE DRAWINGS

The invention is further described by way of illustrative example by reference to the annexed drawings, in which.

DESCRIPTION OF THE ILLUSTRATED EMBODIMENTS.

Figure 1:
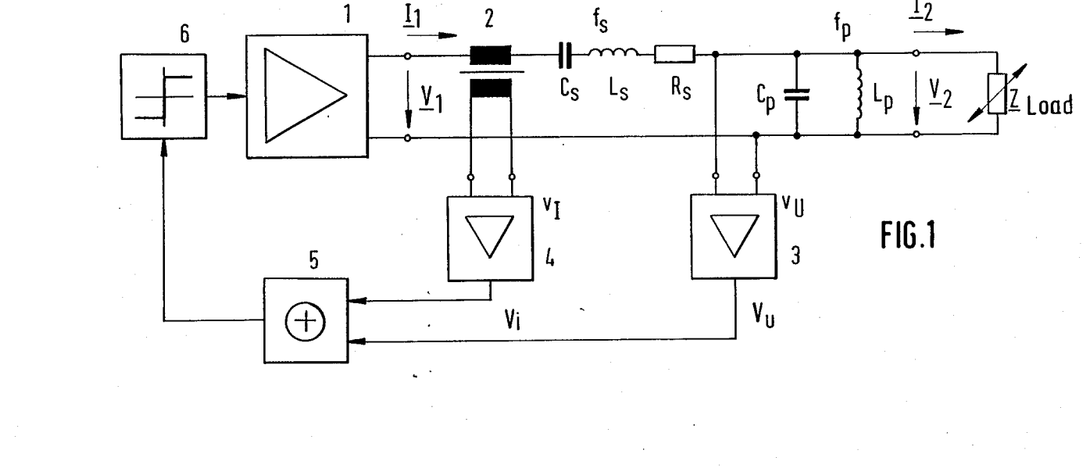
FIG. 1 is a basic circuit diagram of a high-frequency power oscillator according to the invention.

FIG. 1 shows a basic circuit diagram of a high-frequency power oscillator according to the invention. The power amplifier 1 has a circuit branch between its output and its load impedance $Z_{load}$ shown in the form of a two-wire connection, whereas in general the flow of a signal is shown, for reasons of simplicity, with single lines provided with arrowheads to show the direction of signal flow.

At the output of the power amplifier 1 a converter 2 is shown, typically a so-called current transformer, by means of which a magnitude proportional to the output current $I_1$ can be coupled out. Beyond the converter 2 there follows a series-resonant circuit composed of the inductance $L_s$ and the capacitance $C_s$. $R_s$ represents the loss resistance of the series resonance circuit and $f_s$ is its frequency of resonance Beyond the series resonance circuit there is connected a parallel-resonant circuit composed of the inductance $L_p$ and the capacitance $C_p$. The load impedance ultimately connected to the high-frequency power oscillator is $Z_{load}$ and $f_p$ designates the resulting frequency of resonance of the parallel-resonant circuit taking account of the reactive (imaginary) parallel component of the load impedance.

The first portion of the driving voltage for the power amplifier 1 is derived by the converter 3 from the Voltage present across the parallel-resonant circuit. The second portion of the driving voltage is obtained by means of the coupling unit 4 from the converter 2. The two portions of the driving voltage are combined in an addition circuit 5 and then supplied to a pulse-shaping or modifying stage 6 to the input of the power amplifier 1. The addition circuit 5 may be referred to as an algebraic addition circuit, since it makes no difference whether the necessary relative polarities of the first and second portions of the control voltage $V_u$ and $V_i$ are provided at the outputs of the circuits 3 and 4 or whether that relative polarity is provided in the addition circuit 5. In the illustrated case the former is assumed to be the case and the addition circuit 5 marked with a + sign.

Figure 2:
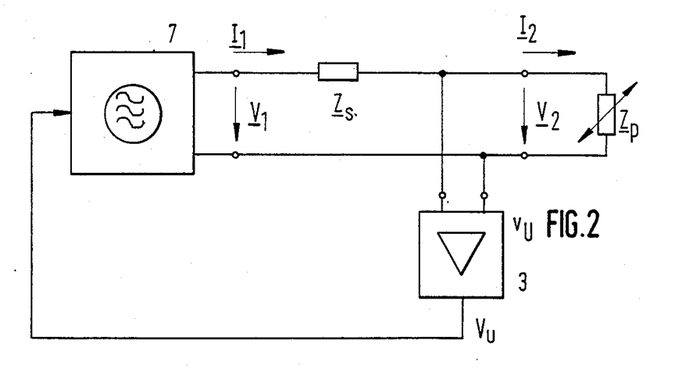
FIG. 2 is a basic diagram of a high-frequency power oscillator excited by voltage feedback.

In order to explain more closely the mixed voltage feedback and current inverse feedback, the basic circuit is shown in FIG. 2 for a simple voltage feedback without the current inverse feedback (current counterfeedback) which is a characterizing feature of the invention. The series-resonant circuit is here shown by the impedance $Z_S$ and the parallel connection of parallel-resonant circuit and load impedance $Z_{load}$ is shown simply by the impedance $Z_p$. The oscillator amplifier 7 is intended to designate a combination of the power amplifier 1 and the pulse modification stage 6.

The pulse-shaping stage 6 serves the conventional purpose providing a rectangular-shaped output pulse from every small input voltage change of practically any kind which has an amplitude sufficient for exciting the power amplifier. The amplification of the pulse-shaping stage can therefore be regarded as almost or practically infinite. The loop amplification necessary for the self-excited state or oscillation of the amplifier 1 is automatically obtained by boundary condition properties of the power amplifier together with the very high amplification of the pulse-shaping stage 6. Accordingly only the phase condition requirement remains to be fulfilled for establishing self-excitation.

The phase condition for the oscillator of FIG. 2 is expressed as follows:

$$\arg\left\{\frac{Z_p}{Z_p + Z_s}\right\} + \phi_0 = 0 \qquad (2)$$

In the above expression the $\phi_0$ is the phase shift to which the signal in the coupling branch 3 and in the oscillator amplifier 7 is subjected. In practice these components of the circuit are so dimensioned that $\phi_0$ is approximately zero. If then the series-resonant circuit is determined by its resonant quality Q, as follows:

$$Q_s = \omega L_s / R_s \qquad (3)$$

and the parallel-resonant circuit by its Q $$Q_p = R_p / \omega L_p \qquad (4)$$

the operating frequency can then be calculated from equation (2) as $$f \approx \sqrt{f_s \cdot f_p} \ \frac{\sqrt{f_s \cdot Q_s + f_p \cdot Q_p}}{\sqrt{f_p \cdot Q_s + f_s \cdot Q_p}} \qquad (5)$$

In equation (5) it can be seen that the operating frequency f tends to approach the resonant frequency $f_s$ of the series-resonant circuit the higher the value of $Q_s$ is. When there is a deviation from each other of the two resonant frequencies $f_p$ and $f_s$ the above-described problems then occur.

Figure 3:
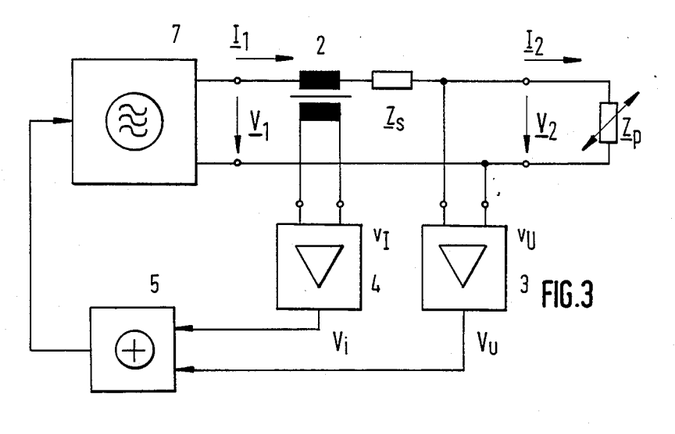
FIG. 3 is a basic diagram of a high-frequency power oscillator having voltage feedback and also having supplementary current inverse feedback.

In FIG. 3 there is shown in a manner analogous to FIG. 2 the simplified basic circuit for a high-frequency power oscillator according to the invention with superimposed voltage feedback and current inverse feedback In this case the current inverse feedback is provided by the converter 2 and the coupling unit 4. For this circuit the phase condition for self-excitation is $$\arg\left(v_u \frac{V_2}{V_1} - R_c \frac{I_1}{V_1}\right) + \phi_0 = 0 \tag{6}$$

where $v_u = V_u/V_2$ is the conversion factor of the coupling unit 3 between the voltage $V_2$ present at the parallel-resonant circuit and the voltage $V_u$ of the addition unit 5, and $R_c = V_i/I_1$ is the conversion factor of the current inverse feedback circuit branch between the output current $I_1$ of the power amplifier and the voltage $V_i$ at the addition unit 5. If it is now again assumed that the phase shift $\phi_0 = 0$ in the addition unit 5 and in the oscillator amplifier 7 is negligibly small, it is possible to write equation (6) after a few transformations as follows:

$$\arg\left(\frac{v_u \cdot Z_p - R_c}{Z_1}\right) = 0 \tag{7}$$

In the above equation $Z_1 = V_1/ = Z_s + Z_p$ is the complex input impedance of the output filter which is presented to the power amplifier at its output. From equation (7) the operating frequency can again be calculated. It is now $$f \approx \sqrt{f_s \cdot f_p} \; \frac{\sqrt{f_s \cdot Q_s/p + f_p \cdot Q_p}}{\sqrt{f_p \cdot Q_s/p + f_s \cdot Q_p}} \tag{8}$$

In equation (8) we find that $$p = \frac{1 + R_c/(v_u \cdot R_s)}{1 - R_c/(v_u \cdot R_{load})} \tag{9}$$

By a suitable choice of $R_c$ and $V_u$ the value $p >> 1$ can be given a suitably large dimension. In this case the Q of the series-resonant circuit has much less effect on the value of the operating frequency f than in the case in which there is no current inverse feedback and the operating frequency f to a considerable extent approximates the resonant frequency $f_p$ of the parallel-resonant circuit. In this way, the above-described advantages are obtained.

At the input of the addition circuit 5 the voltage provided at the output of the coupling unit 3 of the voltage feedback path should be greater than the voltage provided at the output of the coupling unit 4 of the current inverse feedback path, so that the amplitude condition for self-excitation may be fulfilled. In an advantageous development of the invention, the ratio of current inverse feedback to voltage feedback is so set that the following inequality holds:

$$R_c/V_u < R_{minload} \tag{10}$$

In the above equation $v_u$ is the conversion factor for the first portion of the driving voltage in the circuit branch between the voltage $V_2$ at the parallel-resonant circuit and the addition unit 5 and $R_c$ is the conversion factor for the second portion of the driving voltage in the circuit branch between the current $I_1$ in the series-resonant circuit and the addition unit 5. $R_{minload}$ is the lowest value of the real component of the load impedance $Z_{load}$ which appears or is expected in operation.

Figure 4:
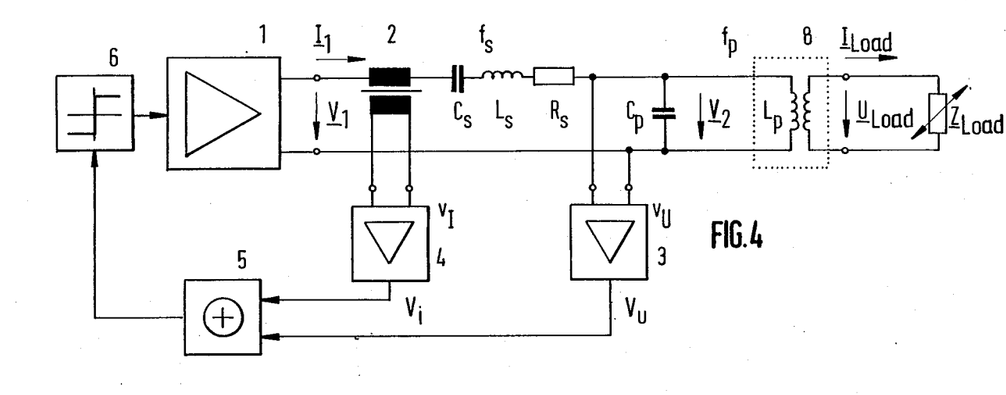
FIG. 4 is a basic circuit diagram of a high-frequency power oscillator having a transformer for impedance matching.

In many cases the limit voltages and limit currents for the transistors in the power amplifier 1 do not accord with the impedance level of the load impedance $Z_{load}$. In a further development of the invention the inductance $L_p$ of the parallel-resonant circuit is accordingly constituted as a transformer matching the load impedance and the desired load impedance for the power amplifier 1. In this case the windings of the transformer 8 have the turns ratio $$w_{pri} : w_{sec} = 1 : t \tag{11}$$

In the above expression the capacitor $C_p$ of the parallel-resonant circuit is connected to the primary winding and the load impedance $Z_{load}$ is connected to the secondary side of the transformer 8. In FIG. 4 there is shown the basic circuit of such a high-frequency power oscillator with a transformer 8 for impedance matching.

In a further development of the invention the inductance $L_p$ of the parallel-resonant circuit is also constituted as a transformer 8. In this case the transformer again has windings of the turns ratio $$w_{pri} : w_{sec} = 1 : t \tag{11}$$

but here the capacitor $C_p$ of the parallel-resonant circuit and also the load impedance are connected to the secondary side of the transformer 8. Because of the impedance transformation of the transformer 8 this can lead to a more suitable value for the resonant circuit capacitance $C_p$.

In another embodiment using a transformer 8, the first portion of the driving voltage is derived from the primary side of the transformer 8. In this case the ratio of current inverse feedback to voltage feedback should satisfy the following inequality:

$$R_c/V_u < R_{minload}/t^2 \tag{12}$$

In the above expression $v_u$ is the conversion factor for the first portion of the driving voltage in the circuit branch between the voltage $V_1$ on the primary side of the transformer 8 and the addition circuit 5, $R_c$ is the conversion factor for the second portion of the driving voltage and the circuit branch between the current $I_1$ in the series-resonant circuit and the addition unit 5, $R_{load}$ is the lowest value of the real portion of the load impedance $Z_{load}$ that may appear during operation and t is the transformation ratio of the transformer.

In a further development utilizing the transformer 8 for impedance matching the first portion of the driving voltage is derived from the secondary side of the transformer 8 and the ratio of current inverse feedback to voltage feedback needs to fulfill the following inequality:

$$R_c/V < R_{minload}/t \quad (13)$$

in which $v_u$ is the conversion factor of the first portion of the driving voltage in the circuit branch between the voltage $V_{load}$ on the secondary side of the transformer 8 and the addition unit 5 $R_c$ is the conversion factor for the second portion of the driving voltage between the current $I_1$ in the series-resonant circuit and the addition unit 5, $R_{load}$ is the lowest value of the real component of the load impedance that may appear during operation and t is the transformation ratio of the transformer 8.

The conversion unit 3 for obtaining voltage feedback can be a simple voltage divider. It can also be a coupling amplifier and can be provided by inductive coupling to the inductance $L_p$ or it can be a partial capacitive coupling to the capacitor $C_p$ of the parallel-resonant circuit, which can take the form of a capacitive voltage divider.

In a further development of the invention the first portion of the voltage can be obtained inductively from the transformer 8 or from the inductance $L_p$ of the parallel-resonant circuit, in which case the ratio of current inverse feedback to voltage feedback should fulfill the inequality:

$$R_c/V_u < R_{minload}/t^2 \quad (14)$$

In this case $v_u$ is the conversion factor for the first of the driving voltage in the circuit branch between the voltage $V_2$ on the primary side of the transformer 8, or of the voltage $V_2$ that is developed across the inductance $L_p$ of the parallel-resonant circuit, and the addition circuit 5. $R_c$ is the conversion factor for the second portion of the driving voltage between the current $I_1$ in the series-resonant circuit and the addition circuit 5, $R_{load}$ is the lowest value of the real component of the load impedance $Z_{load}$ that may appear during operation and t is the transformation ratio of the transformer 8. In the case of a simple inductance $L_p$ the value of t should be set at 1 in the inequality expression (12).

In a further development of the invention it is recommended that the second portion of the driving voltages should be obtained by means of a current converter 2 having its primary winding in one of the two output lines of the power amplifier 1 and has its secondary winding loaded with a resistance the value of which is much smaller (i.e. smaller by at least one order of magnitude)in the operating frequency range than the inductive impedance of the secondary winding of the current converter 2. The second portion of the driving voltage is then obtained from this last-mentioned resistance. A sufficiently phase-pure conversion of the current value $I_1$ into a voltage suitable for the current inverse feedback effect is thereby obtainable.

Figure 5:
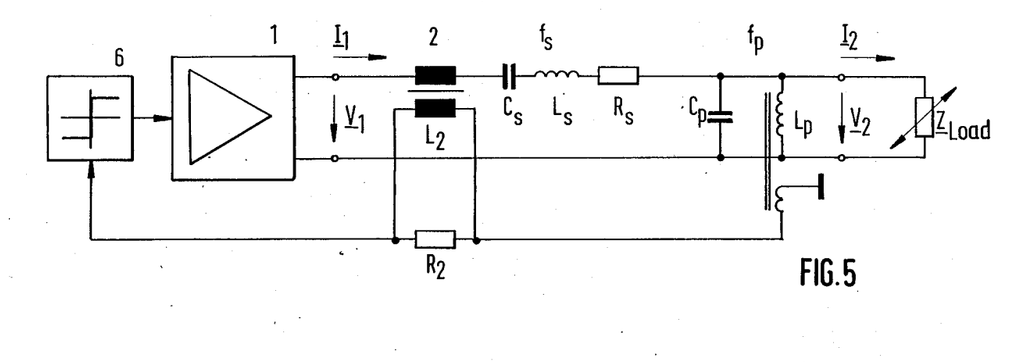
FIG. 5 is a basic circuit diagram of a high-frequency power oscillator having a resistance-loaded current converter.

FIG. 5 shows a basic diagram of an embodiment in which inductive coupling out of the first portion of the driving voltage from the inductance $L_p$ of the parallel circuit is used. In this embodiment also a converter 2 with a resistance $R_2$ in its secondary circuit is utilized. It can be seen that these two measures lead to a particularly simple addition of the two components of the control voltage. A separate addition component 5 is no longer necessary in this case.

In still another development of the invention the second portion of the control voltage is obtained by means of a current converter 2 having its primary winding in one of the two output lines of the power amplifier 1 and having its secondary winding connected to an amplifier of which the input impedance in the operating frequency range is much smaller (i.e. smaller by at least one order of magnitude) than the inductive impedance of the secondary winding of the current converter. The second portion of the control voltage is obtained from the output of this amplifier.

Figure 6:
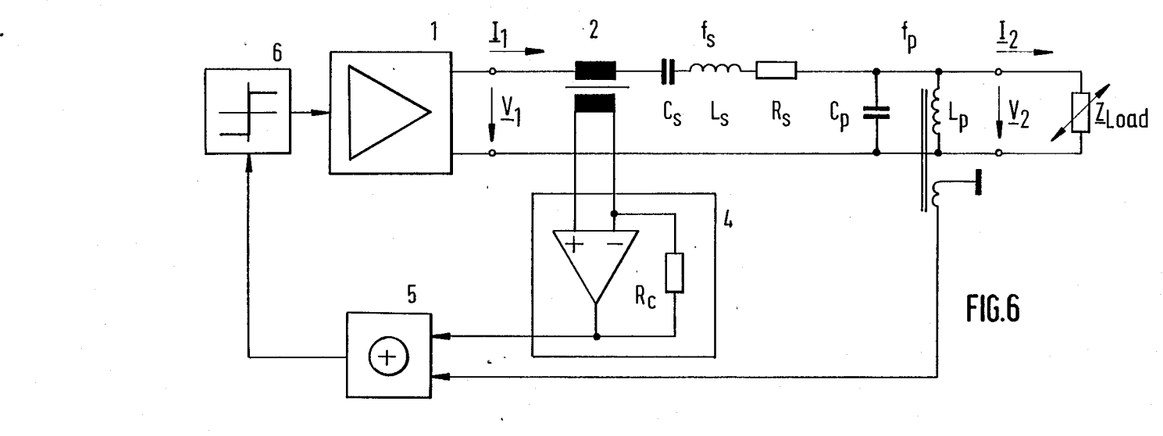
FIG. 6 is a basic circuit diagram of a high-frequency power oscillator with a current converter feeding an amplifier having a low-ohmic input impedance.

In a particularly advantageous arrangement the coupling unit or coupling amplifier 4 is a voltage-coupled operational amplifier, as shown in FIG. 6.

It is possible in a particularly simple embodiment to utilize an ohmic resistance in a well known way to provide the current converter 2. In this case, however, it is necessary to make some provision for potential isolation of the electronics of the feedback circuit branch from the voltages in the output circuit of the frequency power amplifier.

Although the invention has been described with reference to particular illustrative examples, it will be understood that variations and modifications are possible within the inventive concept.

We claim:

1. A feedback-coupled high frequency power oscillator comprising a power amplifier connected as a complementary or quasicomplementary semiconductor stage for operation in a switching mode, an output filter including a series-resonant circuit and a parallel-resonant circuit, each tuned approximately to a midfrequency of operation, said series resonant circuit constituting the first element of said output filter as seen from said power amplifier, and a feedback circuit branch for providing a driving voltage to an input of said power amplifier, said feedback circuit branch comprising:
   voltage feedback means for deriving, from a voltage present in said parallel-resonant circuit, a first component of said driving voltage;
   current inverse feedback means for deriving, from a current flowing in said series resonant circuit, a second component of said driving voltage;
   algebraic addition means (5) having inputs respectively connected to said voltage feedback means and said current feedback means, to produce a resultant feedback voltage, and
   pulse converting means (6) for converting said resultant feedback voltage into said driving voltage.

2. A high-frequency power oscillator according to claim 1, wherein said voltage feedback means and said current inverse feedback means are of respective circuit designs together assuring fullfilment of the inequality $$R_c/V_u < R_{minload}$$

in which $v_u$ is a conversion factor for said first component of said driving voltage between a voltage ($V_2$) in said parallel-resonant circuit ($L_p, C_p$) and a voltage supplied by said voltage feedback means to said addition means (5), $R_c$ is a conversion factor for said second component of said driving voltage between a current ($I_1$) in said series-resonant circuit ($L_s$, $C_s$) and a voltage supplied by said current inverse feedback means to said addition means (5), and $R_{minload}$ is the lowest value, occurring in operation of the oscillator, of the real component of a load impedance value ($Z_{load}$) composed of a real component having an imaginary component in parallel therewith.

3. A high-frequency power oscillator according to claim 1, wherein said parallel-resonant circuit is composed of a capacitance ($C_p$) in parallel with an inductance ($L_p$) which inductance, for purposes of matching a load impedance ($Z_{load}$) to said power amplifier, is constituted as a transformer (8) having primary and secondary windings with a turns ratio of $$w_{pri} : w_{sec} = 1 : t$$

and said capacitor ($C_p$) is connected to said primary winding and said load impedance ($Z_{load}$) is connected to said secondary winding.

4. A high-frequency power oscillator according to claim 1, wherein said parallel-resonant circuit is composed of a capacitance ($C_p$) in parallel with an inductance ($L_p$) which inductance, for purposes of matching a load impedance ($Z_{load}$) to said power amplifier, is constituted as a transformer (8) having primary and secondary windings with a turns ratio of $$w_{pri} : \overline{w}_{sec} = 1 : t$$

and said capacitor ($C_p$) and also said load impedance ($Z$) are both connected to said secondary winding of said transformer.

5. A high-frequency power oscillator according to claim 3, wherein said voltage feedback means is connected to said primary winding of said transformer and in which said voltage feedback means and said current inverse feedback means are of respective circuit designs together assuring fullfilment of the inequality $$R_c / V_u < R_{minload} / t^2$$

in which $v_u$ is a conversion factor for said first component of said driving voltage between a voltage ($V_2$) in said parallel-resonant circuit (Lp Cp) and a voltage supplied by said voltage feedback means to said addition means (5). $R_c$ is a conversion factor for said second component of said driving voltage between a current ($I_1$) in said series-resonant circuit ($L_s$, $C_s$) and a voltage supplied by said current feedback means to said addition means (5), and $R_{minload}$ is the lowest value, occurring in operation of the oscillator of the real component of a load impedance value ($Z_{load}$) composed of a real component having an imaginary component in parallel therewith.

6. A high-frequency power oscillator according to claim 4, wherein said voltage feedback means is connected to said primary winding of said transformer and in which said voltage feedback means and said current inverse feedback means are of respective circuit designs together assuring fullfilment of the inequality $$R_c / V_u < R_{minload} / t^2$$

in which $v_u$ is a conversion factor for said first component of said driving voltage between a voltage ($V_2$) in said parallel-resonant circuit (Lp Cp) and a voltage supplied by said voltage feedback means to said addition means (5), $R_c$ is a conversion factor for said second component of said driving voltage between a current ($I_1$) in said series-resonant circuit ($L_s$, $C_s$) and a voltage supplied by said current feedback means to said addition means (5), and $R_{minload}$ is the lowest value, occurring in operation of the oscillator of the real component of a load impedance value ($Z_{load}$) composed of a real component having an imaginary component in parallel therewith.

7. A high-frequency power oscillator according to claim 3, wherein said voltage feedback means is connected to said secondary winding of said transformer and wherein said voltage feedback means and said current inverse feedback means are of respective circuit designs together assuring fullfilment of the inequality $$R_c / V_u < R_{minload} / t$$

in which $v_u$ is a conversion factor for said first component of said driving voltage between a voltage ($V_2$) in said parallel-resonant circuit (Lp Cp) and a voltage supplied by said voltage feedback means to said addition means (5), $R_c$ is a conversion factor for said second component of said driving voltage between a current ($I_l$) in said series-resonant circuit ($L_s$, $C_s$) and a voltage supplied by said current feedback means to said addition means (5), and $R_{minload}$ is the lowest value, occurring in operation of the oscillator of the real component of a load impedance value ($Z_{load}$) composed of a real component having an imaginary component in parallel therewith.

8. A high-frequency power oscillator according to claim 4, wherein said voltage feedback means is connected to said secondary winding of said transformer and wherein said voltage feedback means and said current inverse feedback means are of respective circuit designs together assuring fullfilment of the inequality $$R_c / v_u < R_{minload} / t$$

which $v_u$ is a conversion factor for said first component said driving voltage between a voltage ($V_2$) in said parallel-resonant circuit (Lp Cp) and a voltage supplied by said voltage feedback means to said addition means (5), $R_c$ is a conversion factor for said second component of said driving voltage between a current ($I_1$) in said series-resonant circuit ($L_s$, $C_s$) and a voltage supplied by said current feedback means to said addition means (5), and $R_{minload}$ is the lowest value, occurring in operation of the oscillator of the real component of a load impedance value ($Z_{load}$) composed of a real component having an imaginary component in parallel therewith.

9. A high-frequency power oscillator according to claim 1, wherein said voltage feedback means is connected for inductively picking up a voltage from an inductance ($L_P$) of said parallel-resonant circuit.

10. A high-frequency power oscillator according to claim 2, wherein said voltage feedback means is connected for inductively picking up a voltage from an inductance ($L_P$) of said parallel-resonant circuit.

11. A high-frequency power oscillator according to claim 5, wherein said voltage feedback means is coupled to said parallel resonant circuit by capacitive divider coupling built into the capacitive portion of said parallel resonant circuit.

12. A high-frequency power oscillator according to claim 8, wherein said voltage feedback means is coupled to said parallel resonant circuit by capacitive divider coupling built into the capacitive portion of said parallel resonant circuit.

13. A high-frequency power oscillator according to claim 7, wherein said voltage feedback means is connected inductively to said transformer constituting the inductance of said parallel-resonant circuit.

14. A high-frequency power oscillator according to claim 8, wherein said voltage feedback means is connected inductively to said transformer constituting the inductance of said parallel-resonant circuit.

15. A high-frequency power oscillator according to claim 13, wherein said current inverse feedback means is connected to said series resonant circuit by means of a current converter (2) having a primary winding in one of two high-frequency output leads of said power amplifier (1) and having a secondary winding loaded with a resistance ($R_2$) having a resistance value in the frequency range of operation of said oscillator which is smaller by at least one order of magnitude than the inductive resistance of said secondary winding of said current converter (2), the connection between said current inverse feedback means and said addition means being taken from across said resistance ($R_2$).

16. A high-frequency power oscillator according to claim 14, wherein said current inverse feedback means is connected to said series resonant circuit by means of a current converter (2) having a primary winding in one of two high-frequency output leads of said power amplifier (1) and having a secondary winding loaded with a resistance ($R_2$) having a resistance value in the frequency range of operation of said oscillator which is smaller by at least one order of magnitude than the inductive impedance of said secondary winding of said current converter (2), the connection between said current inverse feedback means and said addition means being taken from across said resistance ($R_2$).

17. A high-frequency power oscillator according to claim 13, wherein said current inverse feedback means is coupled to said series resonant circuit by means of a current converter (2) having a primary winding in one of the two high-frequency output leads of said power amplifier (1) and having a secondary winding to which an amplifier (4) is connected having an input impedance in the operating range of the oscillator which is smaller by at least one order of magnitude than the inductive impedance of said secondary winding of said current converter (2).

18. A high-frequency power oscillator according to claim 14, wherein said current inverse feedback means is coupled to said series resonant circuit by means of a current converter (2) having a primary winding in one of the two high-frequency output leads of said power amplifier (1) and having a secondary winding to which an amplifier (4) is connected having an input impedance in the operating range of the oscillator which is smaller by at least one order of magnitude than the inductive impedance of said secondary winding of said current converter (2).

19. A high-frequency power oscillator according to claim 17, wherein said amplifier (4) connected to said secondary winding of said current converter is a voltage-coupled operational amplifier.

20. A high-frequency power oscillator according to claim 18, wherein said amplifier (4) connected to said secondary winding of said current converter is a voltage-coupled operational amplifier.

21. A high-frequency power oscillator according to claim 13, wherein said current inverse feedback means is coupled to said series resonant circuit by means of an ohmic resistance interposed in one of two high-frequency output lines of said power amplifier.

22. A high-frequency power oscillator according to claim 14, wherein said current inverse feedback means is coupled to said series resonant circuit by means of an ohmic resistance interposed in one of two high-frequency output lines of said power amplifier.

* * * * *